United States Patent [19]

Noro et al.

[11] Patent Number: 4,980,920
[45] Date of Patent: Dec. 25, 1990

[54] NEGATIVE IMPEDANCE DRIVING APPARATUS HAVING TEMPERATURE COMPENSATION CIRCUIT

[75] Inventors: Masao Noro; Daisuke Suzuki, both of Hamamatsu, Japan

[73] Assignee: Yamaha Corporation, Hamamatsu, Japan

[21] Appl. No.: 421,256

[22] Filed: Oct. 13, 1989

[30] Foreign Application Priority Data

Oct. 17, 1988 [JP] Japan .................. 63-134511

[51] Int. Cl.[5] .............................. H04R 3/00
[52] U.S. Cl. .......................... 381/96; 381/59
[58] Field of Search .................... 381/96, 59

[56] References Cited

U.S. PATENT DOCUMENTS

| | | | |
|---|---|---|---|
| 4,387,270 | 6/1983 | Sakano et al. | 381/96 |
| 4,395,588 | 7/1983 | Franssen et al. | 381/96 |
| 4,550,430 | 10/1985 | Meyers | 381/96 |
| 4,573,189 | 2/1986 | Hall | 381/96 |
| 4,614,914 | 9/1986 | Hofer | 330/149 |
| 4,837,832 | 6/1989 | Fanshel | 381/105 |

*Primary Examiner*—Forester W. Isen
*Attorney, Agent, or Firm*—Spensley Horn Jubas & Lubitz

[57] ABSTRACT

A driving apparatus for negative-impedance driving a speaker as a load, comprises a detection element, a positive feedback circuit, a temperature compensation circuit, a sensor element, a control circuit, and an input f characteristic control circuit. The resistor as the detection element connected in series with the load detects a current flowing through the load. The feedback circuit feeds back a detection output of the detection element to an input side of the driving apparatus. The temperature compensation circuit controls the negative-impedance driving state to compensate for an increase in load impedance upon an increase in temperature of the load. The sensor element detects that a temperature of the load reaches a predetermined value. The control circuit stops temperature compensation of the temperature compensation circuit or decreases a degree of temperature compensation in accordance with an output from the sensor element. The input f characteristic control circuit controls frequency characteristic of an input signal in accordance with an output from the control circuit.

12 Claims, 3 Drawing Sheets

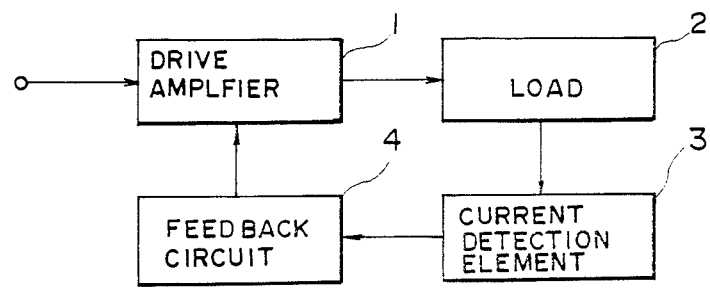
F I G. 1
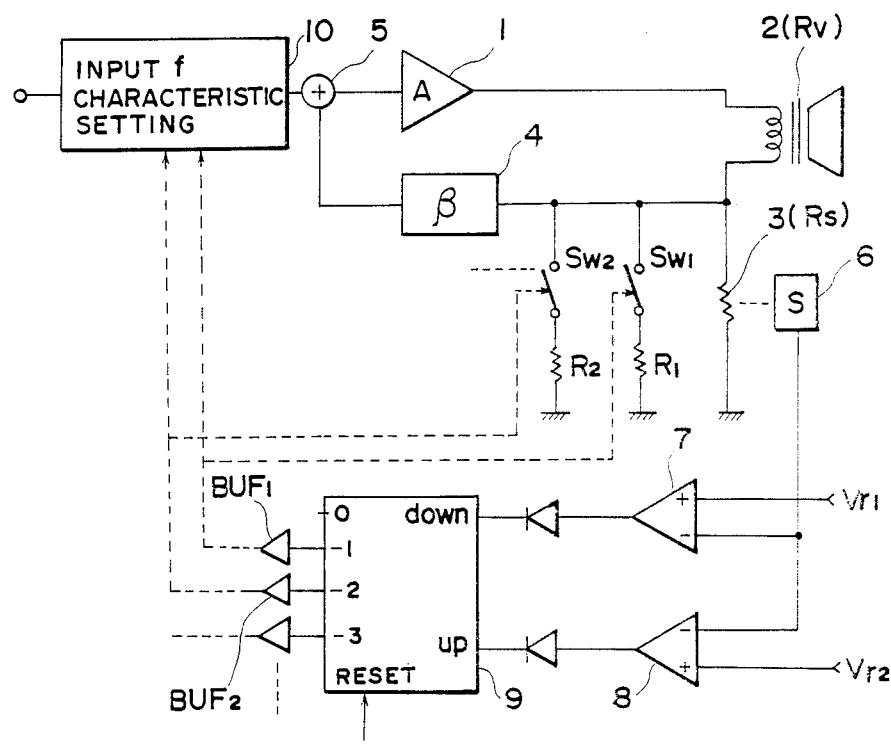
F I G. 2

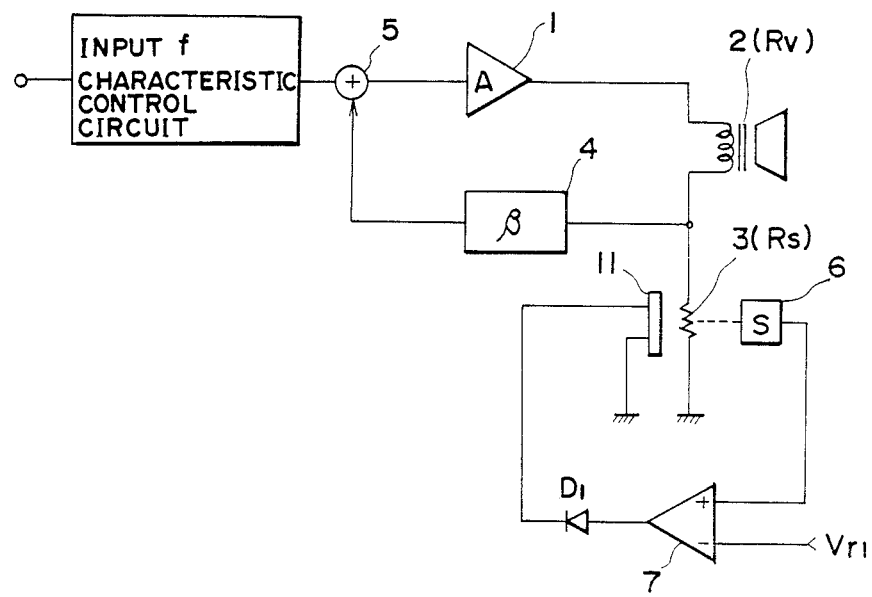
F I G. 3
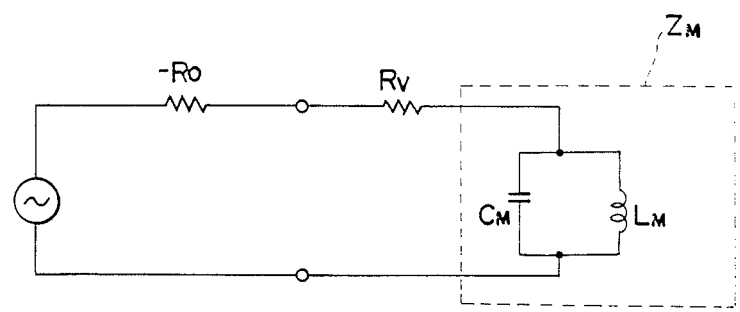
F I G. 4

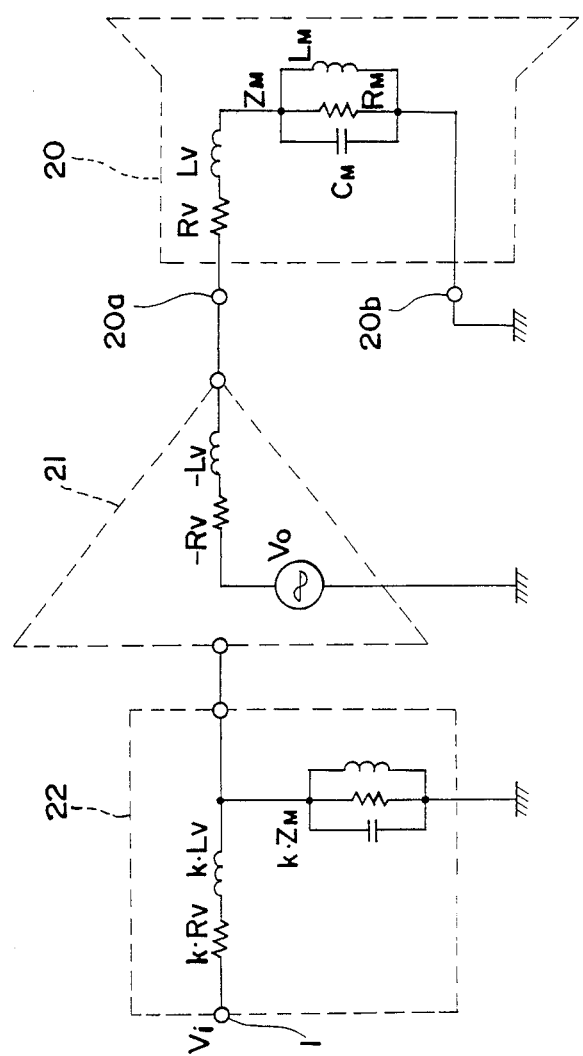
F I G. 5

NEGATIVE IMPEDANCE DRIVING APPARATUS HAVING TEMPERATURE COMPENSATION CIRCUIT

BACKGROUND OF THE INVENTION

1. Field of the Invention

The present invention relates to a driving apparatus for negative-impedance driving a load and, more particularly, to a driving apparatus comprising a temperature compensation circuit which performs temperature compensation for preventing or eliminating a change in drive state caused by a change in temperature of a load and prevents the load from being heated beyond a safety range during temperature compensation.

2. Description of the Prior Art

In general, an electro-magnetic transducer (a dynamic electro-acoustic transducer) such as a speaker obtains a drive force by supplying a current i through a coil (copper wire coil) in a magnetic gap of a magnetic circuit. The drive force F appearing in the copper wire coil is given by:

$$F = B \cdot l \cdot i$$

where l is the conductor length of the coil, and B is the strength of a magnetic field of the magnetic gap. However, since the coil formed of a copper wire or the like has a positive temperature coefficient, its resistance changes depending on a temperature. For this reason, in the case of constant-voltage driving, the current i flowing through the copper wire coil changes depending on a temperature, and hence, a drive force is changed. The above-mentioned electro-magnetic transducer system generally has a motional impedance, and the resistance component of the copper wire coil serves as a damping resistance of this motional impedance. Therefore, a damping force also changes in accordance with a temperature.

In order to obtain a larger drive force and damping force than those of the conventional constant-voltage driving, there is proposed a system in which a negative impedance is equivalently generated in a driver side, and a load is negative-impedance driven through the negative impedance. In order to equivalently generate the negative impedance, a current flowing through the load must be detected. For this purpose, a detection element is connected in series with the load. In the system of performing negative-impedance driving, since an impedance of the load is apparently canceled by the equivalently generated negative impedance, a large drive force and damping force can be simultaneously realized. FIG. 4 is an equivalent circuit diagram of this system. In FIG. 4, reference symbols $C_M$ and $L_M$ denote a capacitance component and an inductance component of a motional impedance $Z_M$ of an electro-magnetic transducer (speaker), respectively; and $R_V$, an internal resistance of a voice coil as a load. The internal resistance $R_V$ is eliminated by a negative resistance $-R_O$ equivalently formed at the driving side, and an apparent drive impedance $Z_A$ is given by:

$$Z_A = R_V - R_O$$

If $Z_A$ becomes negative, the circuit operation is rendered unstable. Therefore, the values of $R_V$ and $R_O$ are set as $R_V \geq R_O$.

In the conventional negative-impedance driving system, the large drive force and damping force are realized. However, it is difficult to obtain a uniform drive impedance with respect to a motional impedance over a wide temperature range. For example, in the circuit of FIG. 4, if the equivalent negative resistance $-R_O$ is set to be constant regardless of a temperature, the ratio of influence of a change in resistance of $R_V$ caused by a change in temperature with respect to the drive impedance $Z_A$ becomes larger than that in the case of the constant-voltage driving.

In a driving apparatus disclosed in U.S. patent application Ser. No. 07/357,701 assigned to the present assignee, a temperature coefficient of a detection element for detecting a current flowing through a load is set to be equal to or slightly larger than a load impedance of the load, thereby eliminating the conventional drawbacks.

In the negative impedance driving apparatus of the application U.S. Ser. No. 07/357,701, when the load impedance is increased according to an increase in temperature of the load, the absolute value of the negative impedance is also increased. In view of an actual amplifier output, the negative impedance driving is to supply a drive voltage higher than that in a normal drive mode, i.e., a drive power to the load as a negative impedance component, and hence, load power consumption is increased as the negative impedance has a larger absolute value. The power supplied to the load basically causes heat dissipation. For this reason, assuming that a load temperature is increased and the load impedance is increased while an input signal is constant, the driving apparatus having the circuit of the prior application may thermally run away such that the negative impedance is temperature-compensated, its absolute value is increased, power supplied to the load is increased, the load temperature is further increased, load impedance and the negative impedance are further increased, and so on. Thus, the driving apparatus of the application U.S. Ser. No. 07/357,701 has no thermal protection means.

Assuming a maximum output state as a thermal design condition of the driving apparatus and the load, the driving apparatus and the load can rarely be thermally destroyed. Assuming the maximum output taking into consideration that the negative-impedance driving is performed and a drive condition changes due to temperature compensation, the maximum output becomes a considerably larger value than in a normal design condition. Therefore, a problem of excessively high quality may be derived with reference to a conventional thermal stability decision standard.

SUMMARY OF THE INVENTION

It is an object of the present invention to provide a driving apparatus comprising a temperature compensation circuit which can prevent a change in drive state of a load even when a load impedance changes due to a change in temperature of the load, wherein the load can be prevented from being heated beyond a safety range, and the driving apparatus and the load can be prevented from being thermally destroyed without setting the driving apparatus and the load in excessively high quality.

In order to achieve the above object, according to the present invention, there is provided a driving apparatus for detecting a current flowing through a load and feeding a detection result back to an input side of the apparatus to negative-impedance drive the load, comprising temperature compensation means for controlling the negative-impedance drive state to compensate for an increase in load impedance caused by an increase in temperature of the load, detection means for detecting that the temperature of the load reaches a predetermined value, and temperature compensation control means for stopping the temperature compensation or decreasing a degree of temperature compensation in accordance with an output from the detection means.

In the driving apparatus of the present invention, the temperature compensation means controls the negative impedance drive state to almost completely compensate for an increase in load impedance caused by an increase in temperature until the temperature of the load reaches a predetermined value. Thus, the negative-impedance drive state (drive impedance) can be kept almost constant.

When the load temperature has reached the predetermined value, the temperature compensation control means stops the temperature compensation or decreases the degree of temperature compensation. For example, at a temperature equal to or higher than the predetermined temperature, an increase in absolute value of the negative impedance with respect to an increase in temperature is moderated or stopped, or the absolute value of the negative impedance is decreased. Thus, the absolute value of the negative impedance is kept almost constant even if the temperature is increased, or is decreased along with an increase in temperature. In contrast to this, the load impedance is increased as the temperature is increased. Therefore, when the increase is stopped, the absolute value of the negative impedance is constant, and a drive voltage is not increased. Therefore, power consumption of the load is relatively decreased as the load impedance is increased, and the load temperature is decreased. However, when the temperature is decreased, the load impedance is decreased, and power consumption is increased. As a result, the load temperature is stabilized at a balance point. The stable point is substantially equal to the predetermined value. When the absolute value of the negative impedance is decreased along with an increase in temperature, power supply to the load is forcibly decreased. As a result, the load temperature is decreased.

Therefore, according to the present invention, when the load temperature exceeds the predetermined value, a further increase in drive voltage in the driving apparatus is limited, and power consumption of the load is naturally decreased along with an increase in load impedance or is forcibly decreased since the absolute value of the negative impedance is decreased. Therefore, thermal destruction of the load and the driving apparatus can be reliably prevented without setting the load and the driving apparatus in excessively high quality.

BRIEF DESCRIPTION OF THE DRAWINGS

FIG. 1 is a block diagram showing a basic arrangement of a driving apparatus according to an embodiment of the present invention;

FIG. 2 is a circuit diagram showing a first embodiment of the driving apparatus shown in FIG. 1;

FIG. 3 is a circuit diagram showing a second embodiment of the driving apparatus shown in FIG. 1;

FIG. 4 is an equivalent circuit diagram of a drive system of a dynamic electro-acoustic transduces; and FIG. 5 is an equivalent circuit diagram of a frequency characteristics compensation system.

DETAILED DESCRIPTION OF THE PREFERRED EMBODIMENTS:

Preferred embodiments of the present invention will now be described with reference to FIGS. 1 to 3. The same reference numerals denote the same parts throughout the drawings, and a repetitive description thereof will be omitted.

FIG. 1 shows a basic arrangement of a driving apparatus according to an embodiment of the present invention. In FIG. 1, a load 2 is connected to the output of a drive amplifier 1. A load current detection element 3 is connected to the load 2. For example, the current detection element 3 is connected in series with the load 2. A load current detection signal from the current detection element 3 is positively fed back to the drive amplifier 1 through a feedback circuit 4. With this positive feedback operation, a negative resistance $-R_O$ is generated at the output side of the drive amplifier 1, and the resistance component of the load 2 is eliminated or canceled.

The current detection element 3 is subjected to temperature compensation for compensating for a change in load resistance caused by heat dissipation of the load to stabilize the eliminating or canceling state. More specifically, the current detection element 3 has a resistor having a temperature coefficient equivalent to that of the load 2, and is mounted so that its temperature changes to follow the load 2. Thus, the current detection element 3 supplies to the feedback circuit 4 a load current detection output which is temperature-compensated in accordance with the temperature of the load 2.

The feedback circuit 4 provides an upper limit temperature limiter to the temperature compensation. The limiter functions as follows:

(1) When a limit (upper limit) temperature is reached, the limiter stops a further increase in absolute value $R_O$ of a negative resistance, or (2) when the limit temperature is reached, the limiter decreases the absolute value $R_O$ of the negative resistance.

In the latter case, when the load temperature reaches the limit temperature again even if $R_O$ is decreased, the limiter further decreases $R_O$, and corrects frequency characteristics of an input signal in accordance with a decrease in $R_O$. On the other hand, when the load temperature is decreased below a predetermined recover temperature, the limiter recovers $R_O$ and frequency characteristics of the input signal to a state before one stage.

FIG. 2 shows an embodiment of the latter case shown in FIG. 1. In FIG. 2, a voice coil $R_V$ of a speaker as the load 2 is connected to the output side of the drive amplifier 1 of a gain A. A detection resistor $R_S$ serving as the load current detection element 3 is connected to the voice coil $R_V$. A connecting node between the load 2 and the detection resistor $R_S$ is connected to the feedback circuit 4 of a transmission gain $\beta$, and the output of the detection resistor is positively fed back to the amplifier 1 through an adder 5. When the load 2 is negative-impedance driven, the load 2 and the detection element 3 are assumed to be at the same temperature, and a load impedance $Z_V$ ($=R_V$) of the load 2 and a detection impedance $Z_S$ ($=R_S$) of the detection element 3 have the same temperature coefficient. A negative-resistance driving apparatus section constituted by the drive amplifier 1, the load 2, the load current detection element 3, the feedback circuit 4, and the adder 5 is common to that in the application U.S. Ser. No. 07/357,701.

In FIG. 2, an impedance when the drive amplifier 1 side is viewed from the load 2 (to be referred to as an output impedance of the drive amplifier 1 hereinafter for the sake of simplicity) $Z_O$ is given by:

$$Z = R_S(1 - A\beta)$$

Therefore, when $A\beta < 1$, negative-impedance driving can be performed while the output impedance $Z_O$ of the drive amplifier 1 can be negative ($-R_O$).

If the resistance of the load resistor $R_V$ at 0° C. is represented by $R_{VO}$, the temperature coefficient of the material of the load 2 is represented by $K_T$, and the temperature of the load 2 is represented by T (° C.), the load impedance $R_V$ is given by:

$$R_V = (1 + K_T \cdot T) R_{VO}$$

If the resistance of the detection resistor $R_S$ at 0° C. is represented by $R_{SO}$, the temperature coefficient of the detection element 3 is represented by $K_T$ which is the same as the load 2, and the temperature of the detection element is represented by T (° C.) which is the same as the load 2, the detection impedance $R_S$ is given by:

$$R_S = (1 + K_T \cdot T) R_{SO}$$

Therefore, the drive impedance $Z_A$ with respect to a motional impedance $Z_M$ is given by:

$$\begin{aligned} Z_A &= R_V + R_S(1 - A\beta) \\ &= (1 + K_T \cdot T)R_{VO} + \\ &\quad (1 + K_T \cdot T)R_{SO}(1 - A\beta) \\ &= (1 + K_T \cdot T) \cdot [R_{VO} + R_{SO}(1 - A\beta)] \end{aligned}$$

Thus, if the detection impedance $R_S$ is caused to have the same temperature coefficient as that of the load impedance $R_V$, when the load 2 and the detection element 3 are at the same temperature, the influence of the temperature coefficient can be decreased as small as that in the case of constant-voltage driving even if $(1 - A\beta)$ is negative.

The driving apparatus shown in FIG. 2 also comprises a temperature sensor 6 for detecting a temperature of the detection resistor $R_S$ as a temperature of the load 2 (the voice coil of the speaker), a comparator 7 for, when the output from the temperature sensor 6 exceeds a voltage $V_{r1}$ corresponding to an upper limit temperature, generating an "H"-level output, a comparator 8 for, when the output from the temperature sensor 6 is decreased below a voltage $V_{r2}$ corresponding to a lower limit temperature, generating an "H"-level output, a up/down counter 9 for selectively outputting an "H"-level output to one of a plurality of output terminals corresponding to count values 0, −1, . . . , resistors $R_1$, $R_2$, . . . connected in parallel with the detection resistor $R_S$ through switching elements $SW_1$, $SW_2$, . . . , buffers $BUF_1$, $BUF_2$, . . . , for turning on/off the switching elements $SW_1$, $SW_2$, . . . in accordance with outputs −1, −2, . . . of the counter 9, an input f (frequency) characteristic setting circuit 10 for receiving the outputs from the buffers $BUF_1$, $BUF_2$, . . . as switching control inputs, and switching frequency characteristics of a signal to be supplied to the drive amplifier 1 through the adder 5, and the like. The resistances of the resistors $R_1$, $R_2$, . . . are set to be $R_1 > R_2 > \ldots$, to satisfy $R_S // R_1 > R_S // R_2 > \ldots$.

The counter 9 is reset upon power-on, and outputs an "H"-level output to only an output terminal "0". The counter 9 performs down-counting in response to the leading edge of the "H"-level output from the comparator 7, and performs up-counting in response to the leading edge of the "H"-level output from the comparator 8.

An operation for eliminating a degree of temperature compensation in the driving apparatus shown in FIG. 2 will be described below.

In the driving apparatus of FIG. 2, while the temperature of the load 2 is lower than a predetermined upper limit value, the "H"-level output from the counter 9 appears at only the output terminal "0". In this case, the output impedance $Z_O$ (negative resistance $-R_O$) of the drive amplifier 1 is given by:

$$\begin{aligned} -R_O &= R_S(1 - A\beta) \\ &= (1 + K_T \cdot T)R_{SO}(1 - A\beta) \end{aligned}$$

p When the temperature of the load 2 is increased due to a continuous input source signal at relatively high level or an increase in ambient temperature, or the like and the output voltage of the temperature sensor 6 exceeds the voltage $V_{r1}$ corresponding to the upper limit temperature, the comparator 7 generates the "H"-level output, and the counter 9 performs down-counting in response to the leading edge of the "H"-level output. Thus, the output terminal "−1" of the counter 9 goes to "H" level, and the buffer $BUF_1$ turns on (closes) the switching element $SW_1$ in accordance with this "H"-level output. Therefore, the resistor $R_1$ is connected in parallel with the detection resistor $R_S$, and a synthesized detection resistance $R_S$ is given by:

$$R_S' = R_S // R_1$$

Here and hereafter, the mark "//" means a resistance value of the parallel circuit of the resistors mentioned before and after the mark "//". The output impedance $Z_O'$ (negative resistance $-R_O'$) of the drive amplifier 1 is given by:

$$-R_O' = R_S'(1 - A\beta)$$

Since $R_S' < R_S' | < | -R_O |$ is established, and the negative impedance value is decreased. In this manner, when $|-R_O|$ is decreased to $|-R_O^1|$, the degree of negative-impedance driving is decreased, and is approximate to normal driving ($R_O - 0$). Thus, power supplied to the speaker as the load 2 is essentially decreased. Strictly, this power also depends on an average power of an input source. However, if this average power is assumed to be almost constant, power consumption of the load 2 is decreased due to a decrease in degree of negative-impedance driving, and the temperature of the voice coil as the load 2 is decreased.

Note that the temperature sensor 6 generates a voltage signal according to the temperature of the load (in practice, the temperature of the detection resistor $R_S$ as the detection element 3) at predetermined time (t [sec]) intervals. When the voice coil temperature is not decreased but exceeds the upper limit temperature after the lapse of t [sec] although $|-R_O|$ is decreased by one step, the comparator 7 outputs the "H"-level output, and the counter 9 further performs down-counting. In this manner, the switching element $SW_1$ is turned off (opened), and the switching element SW$_2$ is turned on. As a result, the detection resistance R$_S$″ is changed as follows:

$$R_S'' = R_S // R_2 \, (<R_S')$$

Therefore, the output impedance −R$_O$″ is given by:

$$R_S'' = R_S''(1 - A\beta)$$

Therefore, $|-R_O''| < |-R_O'| < |-R_O|$ is established, and the power consumption of the load is further decreased. In this manner, the detection resistance is decreased, and the absolute value of the output impedance is decreased until the load temperature is decreased below the upper limit value.

As a result, the temperature of the load is prevented from being increased beyond the upper limit temperature, and hence, the load and the driving apparatus can be prevented from thermal destruction.

Note that, in a conventional speaker driving system, a so-called constant-voltage signal is applied to the whole of a speaker comprising a voice coil resistance R$_V$ and a motional impedance Z$_M$, and the frequency characteristics of an input signal to the system is set such that the output sound pressure-frequency characteristics of the speaker is as flat as possible.

On the other hand, U.S. patent application Ser. No. 07/199,479 assigned to the present assignee discloses a frequency characteristics compensation system for the input signal of a dynamic speaker driver which drives a dynamic speaker so as to apply a constant-voltage signal to the motional impedance Z$_M$ of the speaker. If a signal having the same frequency characteristics as that of the conventional system is inputted to said driver, the output sound pressure-frequency characteristics of the dynamic speaker driven cannot be flat and the output sound pressure is remarkably low especially at the lowest resonance frequency. Therefore, in the above compensation system, a BPF (band-pass filter) circuit is provided at an input side of the driver so as to simulate the condition wherein an input signal to the equivalent motional impedance of vibration system of the dynamic speaker is the similar one as in the case of the conventional constant-voltage driving system, whereby sound pressure-frequency characteristics similar to those of a speaker driven by the conventional system can be obtained. FIG. 5 shows an equivalent circuit of the above compensation system. In FIG. 5, numeral 20 denotes a dynamic speaker, 21 denotes a power amplifier or speaker driver and 22 denotes a BPF circuit or input circuit for the driver 21 as a frequency characteristics compensation circuit.

In the embodiment in FIG. 2, in order to compensate for drift of sound pressure-frequency characteristics caused by changing the degree of negative impedance driving, input frequency characteristics control circuit 10 changes the degree of the frequency characteristics compensation of the input signal simultaneously with switching of said detection resistance to simulate voltage transmitting characteristics caused by the total impedance of the equivalent motional impedance Z$_M$ of the speaker 2 and the driving impedance Z$_A$ (=R$_V$−R$_O$) Thereby, the sound pressure-frequency characteristics can be freed of drift and can be made flatter even in a case where the degree of negative impedance driving is changed. Further, it will cause no troubles as in the cases of the aforementioned conventional system and U.S. Ser. No. 07/199,479 system to effect any frequency characteristics control which users wish.

As a result of decreasing of the absolute value of the output impedance, when the power consumption of the load is decreased, the load temperature is decreased, and the output from the temperature sensor is decreased below the voltage V$_{r2}$ corresponding to the lower limit temperature, the comparator 8 generates the "H"-level output, and the counter 9 performs up-counting in response to the leading edge of the "H"-level output. Thus, in the counter 9, its output state (count value) is carried up from an "H"-level state of an immediately preceding output terminal −n (n is an integer equal to or larger than 1) to an "H"-level state of an output terminal −n+1. In response to "H" level of the carried-up output terminal −n+1, the buffer BUF −n+1 turns off the switching element SW$_{|-n+1|}$, and the buffer BUF$_n$ turns on the switching element SW$_n$. Therefore, the detection resistance is set to be R$_S$// R$_n$, and becomes larger than R$_S$// R$_{|-n+1|}$, thus increasing the absolute value of the output impedance. The detection resistance is increased until the count value of the counter 9 becomes 0 unless the load temperature detected every t [sec]exceeds the lower limit temperature, and hence, the absolute value of the output impedance is increased. When the count value of the counter 9 reaches 0, the detection resistance is recovered to R$_S$ in a normal operation state.

FIG. 3 shows a second embodiment of the driving apparatus shown in FIG. 1. When the temperature of a load 2 exceeds a predetermined upper limit value, the apparatus shown in FIG. 3 essentially stops temperature compensation so as not to increase the temperature of a detection resistor 3, so that the load is caused to be approximate to a normal drive state. Thus, the temperature of the load is prevented from being further increased.

In the apparatus shown in FIG. 3, a temperature sensor 6 for detecting the temperature of a detection resistor R$_S$ as the temperature of the load 2, a differential amplifier 7 of a relatively large gain, for, when the output from the temperature sensor 6 exceeds a voltage V$_{r1}$ corresponding to the upper limit temperature, generating an output corresponding to the difference therebetween, and a cooling element 11 driven by the output from the differential amplifier 7 to cool the detection element 3 are added to the negative-resistance driving apparatus constituted by the drive amplifier 1, the load 2, the load current detection element 3, the feedback circuit 4, and the adder 5 as in the application (U.S. Ser. No. 07/357,701). The cooling element 11 may comprise a Peltier element or a fan.

The operation of the driving apparatus of FIG. 3 will be described below.

While the temperature of the load 2 is lower than a predetermined upper limit value, the driving apparatus shown in FIG. 3 strongly drives and damps the load 2 with a stable drive impedance Z$_A$ (=R$_V$−R$_O$) in the same manner as in the negative-resistance driving apparatuses in FIG. 2 and the application (U.S. Ser. No. 07/357,701).

When the temperature of the load 2 exceeds a predetermined upper limit value T$_{r1}$ and an output voltage V$_S$ of the temperature sensor 6 exceeds a voltage V$_{r1}$ corresponding to the upper limit temperature, the differential amplifier 7 generates an output according to a differential voltage (V$_S$−V$_{r1}$) to drive the cooling element 11. Thus, the temperature of the detection resistor $R_S$ is held near the upper limit value $T_{r1}$, and a negative resistance $-R_O'$ is also held near a value given by:

$$-R_O' = R_S'(1 - A\beta)$$
$$= (1 + K_T \cdot T_{r1})R_{S0}(1 - A\beta)$$

Contrary to this, since the temperature of the voice coil as the load 2 is kept increased, a drive impedance $Z_A'$ ($=R_V-R_O'$) is increased to be separated from a stable drive impedance $Z_A$ ($=R_V-R_O$) and is approximate to a normal drive state (constant-voltage driving). Therefore, power supply (load power consumption) is essentially decreased. An increase in temperature of the load 2 is stopped or moderated, and the load 2 and the driving apparatus can be prevented from thermal destruction.

On the other hand, when the temperature of the load 2, i.e., the detection element 3 is decreased below the upper limit value $T_{r1}$, the differential amplifier 7 outputs a negative output, and the operation of the cooling element 11 is inhibited by a diode $D_1$. Thus, the operation of the cooling element 11 is stopped, and the temperature of the detection element 3 becomes equal to the temperature of the load 2. As a result, the apparatus can be recovered to a stable negative-impedance driving state by the temperature compensation as in the application (U.S. Ser. No. 07/357,701).

When input f characteristic correction is performed in the apparatus of FIG. 3, f characteristics of an input f characteristic control circuit can be adjusted or switched according to the output from the differential amplifier 7.

(Modification of Embodiment)

The present invention is not limited to the above embodiments, and various changes and modifications may be made within the spirit and scope of the invention.

For example, when a thermistor such as a positive characteristic thermistor having appropriate temperature characteristics, series/parallel circuits constituted by various thermistors and resistors, or a circuit having appropriate temperature characteristics upon combination of these circuits and active circuits is used, the above three functions, i.e., load current detection, temperature detection, and temperature compensation can be realized by a single circuit.

What is claimed is:

1. A driving apparatus for effecting a negative-impedance driving on a load, comprising:
   a detection means, connected to the load, for detecting a current flowing through a load;
   a feedback means for feeding back a detection result of said detection means to an input side of the driving apparatus;
   a temperature compensation means for controlling a negative-impedance driving state to compensate for an increase in load impedance upon an increase in temperature of the load;
   a sensor means for detecting that a temperature of the load reaches a predetermined value; and
   a control means for stopping a temperature compensation of said temperature compensation means or decreasing a degree of temperature compensation in accordance with an output from said sensor means.

2. A driving apparatus according to claim 1, wherein said load is a speaker.

3. A driving apparatus according to claim 1, wherein an input frequency characteristics control circuit is provided at the input side of the apparatus so as to control frequency characteristics of an input signal for the apparatus in response to an output of said control means, said input signal being amplified by the apparatus and supplied to said load.

4. A driving apparatus according to claim 3, wherein said input frequency characteristics control circuit comprises a filter circuit which is electrically simulated so that said frequency compensation characteristics are changed in response to the output of the control means.

5. A driving apparatus according to claim 1, wherein said detection means comprises a detection element connected with said load in series.

6. A driving apparatus according to claim 5, wherein said detection element is set to be equal to said load in temperature and a temperature coefficient of detection impedance of said detection element is equal to a temperature coefficient of a load impedance of said load.

7. A driving apparatus according to claim 5, wherein said control means comprises at least one control element to be connected with said detection element in parallel and causes to change a detection resistance 8. A driving apparatus according to claim 7, wherein said control means further comprises at least one switching means each of which is capable of connecting one of a plurality of control elements with the load and turning of which is controlled by an output of said sensor means.

9. A driving apparatus according to claim 5, wherein said control means comprises a cooling means for cooling said detection element in response to an output of said sensor means.

10. A driving apparatus according to claim 9, wherein said cooling means is a Peltier element.

11. A driving apparatus according to claim 9, wherein said cooling means is a fan.

12. A driving apparatus according to claim 5, wherein said sensor means comprises a sensor element generating a voltage corresponding to a temperature of the load and a comparator for comparing an output voltage of the sensor element with a predetermined voltage and for, when the output voltage exceeds the predetermined voltage, sensing the fact that the temperature of the load reaches the predetermined value to generate a sensing output.

* * * * *